United States Patent
Wang et al.

(10) Patent No.: US 10,517,179 B2
(45) Date of Patent: Dec. 24, 2019

(54) MATERIAL COMPOSITION AND METHODS THEREOF

(71) Applicant: Taiwan Semiconductor Manufacturing Co., Ltd., Hsinchu (TW)

(72) Inventors: Siao-Shan Wang, Tainan (TW); Cheng-Han Wu, Taichung (TW); Ching-Yu Chang, Yilang County (TW); Chin-Hsiang Lin, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/621,646

(22) Filed: Jun. 13, 2017

(65) Prior Publication Data

US 2018/0177055 A1    Jun. 21, 2018

Related U.S. Application Data

(60) Provisional application No. 62/434,886, filed on Dec. 15, 2016.

(51) Int. Cl.
| | |
|---|---|
| *H01L 21/027* | (2006.01) |
| *H05K 3/06* | (2006.01) |
| *G03F 7/09* | (2006.01) |
| *G03F 7/00* | (2006.01) |
| *G03F 7/20* | (2006.01) |
| *G03F 7/40* | (2006.01) |

(52) U.S. Cl.
CPC ........... *H05K 3/064* (2013.01); *G03F 7/0002* (2013.01); *G03F 7/0035* (2013.01); *G03F 7/094* (2013.01); *G03F 7/202* (2013.01); *G03F 7/405* (2013.01); *H01L 21/0274* (2013.01)

(58) Field of Classification Search
CPC .......................... H01L 21/027; H01L 21/0335
See application file for complete search history.

(56) References Cited

U.S. PATENT DOCUMENTS

| | | |
|---|---|---|
| 8,796,666 B1 | 8/2014 | Huang et al. |
| 9,012,132 B2 | 4/2015 | Chang |
| 9,028,915 B2 | 5/2015 | Chang et al. |
| 9,093,530 B2 | 7/2015 | Huang et al. |
| 9,146,469 B2 | 9/2015 | Liu et al. |
| 9,213,234 B2 | 12/2015 | Chang |

(Continued)

*Primary Examiner* — Mohammad M Choudhry
(74) *Attorney, Agent, or Firm* — Haynes and Boone, LLP

(57) ABSTRACT

Provided is a material composition and method that includes forming a patterned resist layer on a substrate. The patterned resist layer has a first pattern width, and the patterned resist layer has a first pattern profile having a first proportion of active sites. In some examples, the patterned resist layer is coated with a treatment material. In some embodiments, the treatment material bonds to surfaces of the patterned resist layer to provide a treated patterned resist layer having a second pattern profile with a second proportion of active sites greater than the first proportion of active sites. By way of example, and as part of the coating the patterned resist layer with the treatment material, a first pattern shrinkage process may be performed, where the treated patterned resist layer has a second pattern width less than a first pattern width.

20 Claims, 7 Drawing Sheets

(56) References Cited

U.S. PATENT DOCUMENTS

| | | |
|---|---|---|
| 9,223,220 B2 | 12/2015 | Chang |
| 9,256,133 B2 | 2/2016 | Chang |
| 9,536,759 B2 | 1/2017 | Yang et al. |
| 9,548,303 B2 | 1/2017 | Lee et al. |
| 2004/0266076 A1* | 12/2004 | Doris .................... H01L 21/845 438/157 |
| 2008/0187758 A1* | 8/2008 | Yokokawa ............. B05D 1/185 428/411.1 |
| 2010/0151126 A1* | 6/2010 | Iseki ...................... B05D 1/005 427/240 |
| 2013/0122425 A1* | 5/2013 | Yoshida .................. G03F 7/405 430/285.1 |
| 2016/0033869 A1* | 2/2016 | Hustad .................... G03F 7/325 438/761 |
| 2016/0268525 A1* | 9/2016 | Bellman ............. H01L 51/0512 |
| 2016/0293403 A1* | 10/2016 | Muramatsu ......... H01L 21/0271 |

* cited by examiner

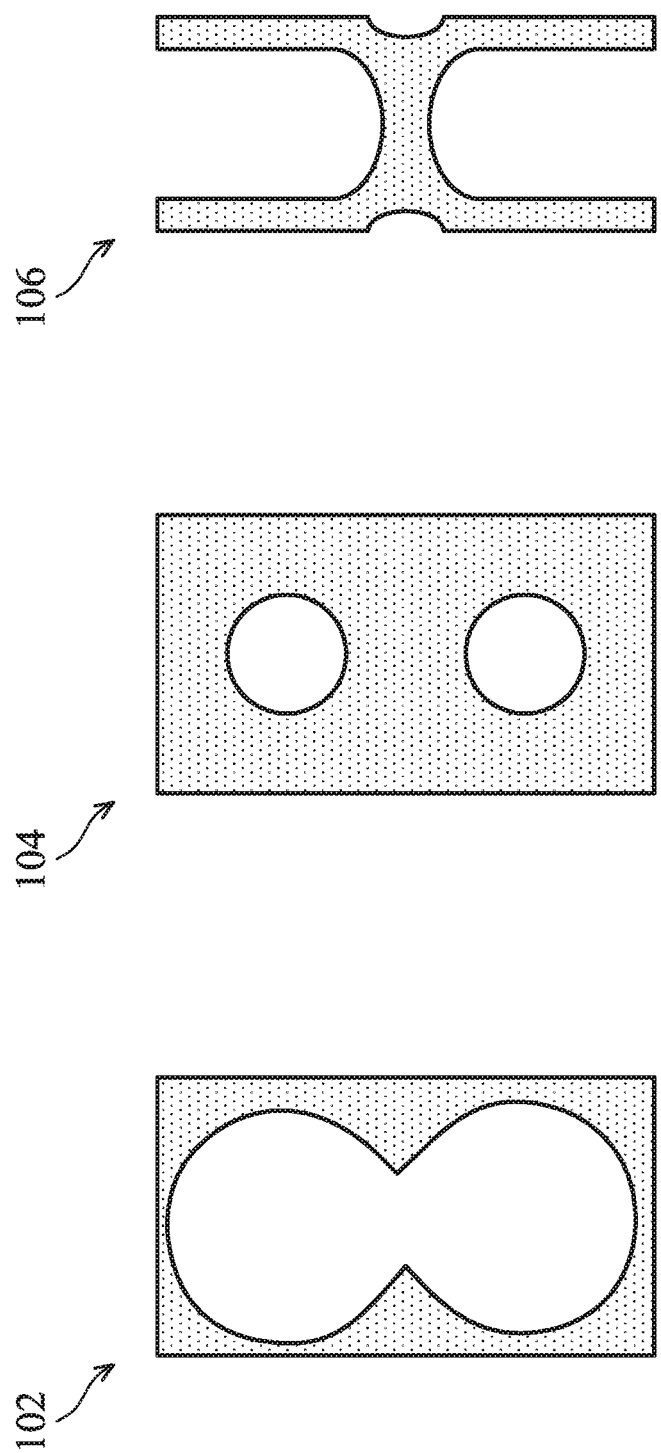

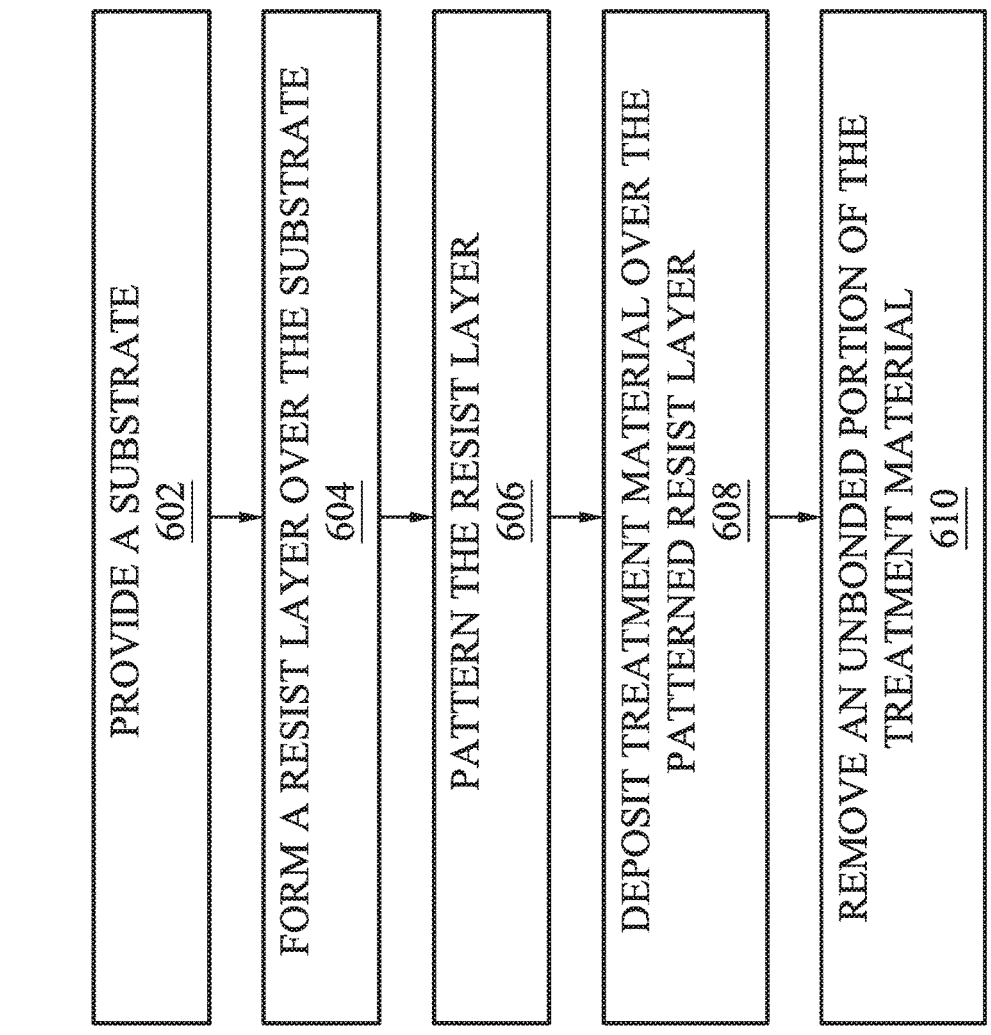

MATERIAL COMPOSITION AND METHODS THEREOF

CROSS-REFERENCE TO RELATED APPLICATIONS

This application claims the benefit of U.S. Provisional Application No. 62/434,886, filed Dec. 15, 2016, the entirety of which is incorporated by reference herein.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Generally, the minimum feature size of a given semiconductor IC is a function of the wavelength of a radiation source used in a lithography process, as well as a resist composition and resist selectivity, among other factors. As semiconductor lithography has progressed, the wavelength of the radiation source used has decreased, and the radiation source itself may be relatively weak, such that photoresists have been designed to utilize radiation sources as efficiently as possible. As one example, chemically amplified photoresist (CAR) compositions have been introduced in an effort to increases a resist's sensitivity to an exposing light source. However, CAR systems have encountered limitations which are difficult to overcome, such as poor photon absorption in thin films, moderate etch selectivity, and limited gains in resolution. Moreover, the need for photoresists with high resolution, low line width roughness (LWR), and high sensitivity has increased more rapidly than the capability provided by such CAR systems. As such, chemically amplified resists alone may not be able to satisfy the next generation lithography requirements demanded by the continued advances in semiconductor technology.

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 1B, and 1C illustrate examples of guider patterns, in accordance with some embodiments;

FIG. 6 illustrates a flow chart of a method for using the treatment material as part of a post-treatment process, according to various embodiments.

DETAILED DESCRIPTION

Figure 2B:
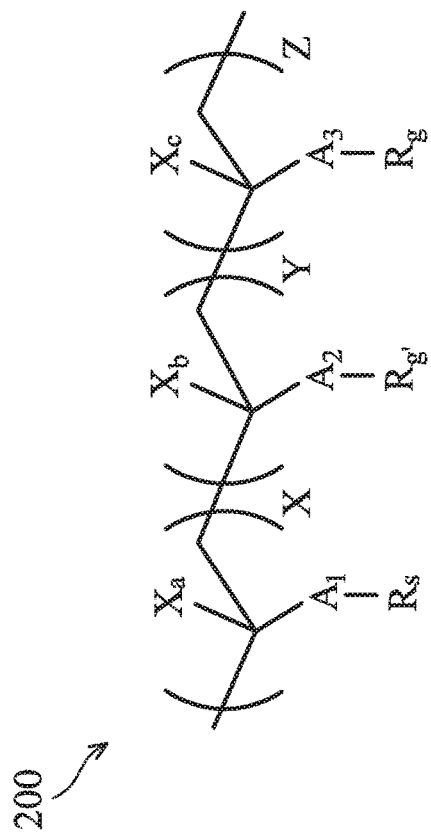
FIGS. 2A and 2B illustrate various aspects of a first treatment material, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to methods for semiconductor device fabrication, and more particularly to material compositions and/or complexes for treatment of a photoresist (resist) material in extreme ultraviolet (EUV) lithography, and methods of using the same. In some cases, the embodiments shown and described herein may also be used for treatment of a resist material in deep UV (DUV) and electron beam (e-beam) lithography. Generally, lithographic patterning includes coating a substrate with a resist film, exposing the resist film to a radiation source (e.g., DUV, UV, or e-beam radiation source), and developing the exposed resist in a developer (a chemical solution). The developer removes portions of the exposed resist, such as exposed portions of a positive-tone resist or unexposed portions of a negative-tone resist, thereby forming a patterned resist layer. The patterned resist layer may then be used as an etch mask in a subsequent etching processes, transferring the pattern of the patterned resist layer to an underlying material layer. Alternatively, the resist pattern is used as an ion implantation mask in a subsequent ion implantation process applied to the underlying material layer, such as an epitaxial semiconductor layer.

Generally, the minimum feature size of a given semiconductor IC is a function of the wavelength of the radiation source used in the lithography process, as well as the resist composition and resist selectivity, among other factors. As semiconductor lithography has progressed, the wavelength of the radiation source used has decreased, for example from 248 nm (e.g., for a KrF laser) to 193 nm (e.g., for an ArF laser) for DUV lithography, and to 13.5 nm for EUV lithography. Radiation sources (light sources) used to produce these wavelengths of light may be relatively weak, such that photoresists have been designed to utilize these light sources as efficiently as possible. Conventionally, this goal has been achieved in part by the use of chemically amplified photoresists, where such chemical amplification increases a resist's sensitivity to the exposing light source. Currently, most semiconductor companies use chemically amplified resists (CAR) for high-volume manufacturing (HVM). Chemically amplified resists have been used for 248 nm (e.g., for a KrF laser) and 193 nm (e.g., for an ArF laser) DUV lithography, as well as for 13.5 nm EUV lithography, but the need for photoresists with higher resolution, lower line width roughness (LWR), and higher sensitivity has increased more rapidly than the capability provided by such resist systems. Adding to the challenge is the so-called "RLS tradeoff", which is a name given to the very difficult task of trying to simultaneously optimize resolution, LWR, and sensitivity. Thus, existing methods have been lacking, and may not be able to adequately satisfy next generation lithography requirements.

At least one approach for further reducing pattern dimensions has been through the use of various photoresist post-treatment methods. Generally, in such methods, a treatment material may be applied to a patterned resist layer in order to provide pattern shrinkage (e.g. critical dimension shrinkage) and/or resolution enhancement, for example, by the use of a type of pattern shrink material. However, at least some post-treatment methods are sensitive to a pattern profile of the resist. Thus, is some cases, a variable resist pattern profile may have different regions (e.g., patterned resist sidewall regions) having different proportions of active sites (e.g., sites that interact with a subsequently deposited layer). In some cases, a material composition may be used to treat a patterned resist layer to modify the pattern profile of the resist prior to performing the pattern shrinkage post-treatment process, but this may incur higher process cost and complexity. Some examples of resist pattern shrinkage have been described, for example, in U.S. patent application Ser. No. 15/010,443 filed Jan. 29, 2016 and entitled "Post Development Treatment Method and Material for Shrinking Critical Dimension of Photoresist Layer", the contents of which are hereby incorporated by reference in their entirety.

Embodiments of the present disclosure offer advantages over the existing art, though it is understood that other embodiments may offer different advantages, not all advantages are necessarily discussed herein, and no particular advantage is required for all embodiments. Generally, and in accordance with embodiments disclosed herein, a material composition and method for treating a resist material (e.g., a patterned resist layer), and thereby providing better pattern shrinkage and/or resolution enhancement, is disclosed. In various embodiments, the material composition and treatment process disclosed herein may be used to minimize the sensitivity to the pattern profile of the resist. In some cases, the embodiments disclosed herein may also be used to modify the pattern profile (e.g., prior to a pattern shrinkage process, where a shrink material may be deposited onto a treated patterned resist layer). Alternatively, in some embodiments, the treatment material disclosed herein may itself be used for the pattern shrinkage process, thereby providing a pattern shrinkage process that is substantially insensitive to the pattern profile of the resist. Generally, in various embodiments, the treatment process disclosed herein may be used to provide a more uniform proportion of active sites on surfaces of a patterned resist layer.

In various embodiments, the material composition and treatment process disclosed herein may be applied to a variety of "guider pattern" types, which may include patterned resist layers. For example, as used herein, some guider pattern examples may include merged or separate 1×2, 1×3, 1×N, or N×N square or elongated holes, where N is greater than 3. Such pattern arrays or chains may be formed in any direction or angle. In some cases, the guider pattern may include peanut shaped patterns or longer trenches. By way of example, and with reference to FIGS. 1A, 1B, and 1C, illustrated therein are at least some types of guider patterns such as a peanut shaped pattern 102, separated hole patterns 104, and an elongated trench pattern 106, respectively. In some embodiments, a subsequent shrink process performed on such patterns (e.g., after the treatment process) may be used to merge narrow width portions of the guider pattern (e.g., to form separate features), to shrink pattern features, or to modify a shape of the pattern features. In some embodiments, the material composition and method disclosed herein may itself be used to perform the shrink process.

Figure 2A:
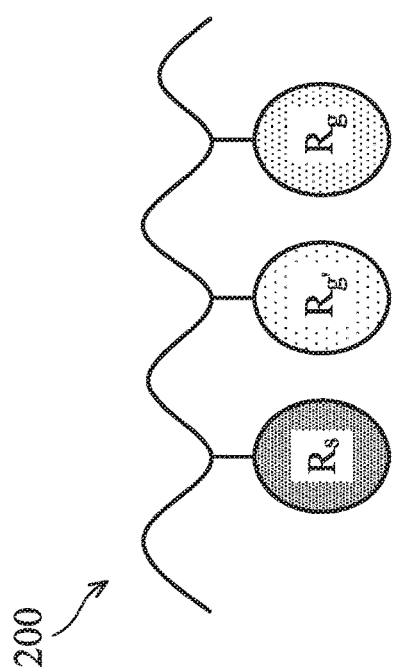

With reference to the example of FIGS. 2A and 2B, illustrated therein is a first treatment material 200, in accordance with some embodiments. In various embodiments, the material composition for treating the resist material (e.g., the treatment material 200) may include one or more of a first grafting monomer ($R_g$), a second grafting monomer ($R_{g'}$), and an organic-soluble monomer ($R_s$). In various examples, the treatment material interacts with the guider pattern (e.g., with the patterned resist layer), for example, such as shown in FIGS. 1A, 1B, 1C. Generally, and in some embodiments, the treatment material may include two or more grafting monomers having different bonding strengths to the guider pattern. By way of example, and in some cases, different regions of the guider pattern may have different types of active sites (e.g., composed of different materials) that bond preferentially to one or more of the grafting monomers having a particular bonding strength. Thus, in various embodiments, the different bonding strengths of the two or more grafting monomers may advantageously provide for uniform coverage of the treatment material across the different regions of the guider pattern regardless of the type of active site present in a particular guider pattern region. In some cases, the profile of the guider pattern (e.g., the guider patterns 102, 104, 106) could be modified at the post-treatment stage (e.g., after being treated with the treatment material 200), for example, using a shrink material deposited on the treated guider pattern. In some embodiments, the treatment material 200 may include a single solvent or a mixture of solvents. In some embodiments, the solvent is an organic solvent that may partially dissolve the guider pattern. In some examples, the solvent may include n-butyl acetate, 2-heptanone, PGMEA, PGME, PGEE, CHN, GBL, and/or MIBC. In some embodiments, the solvent may partially dissolve the guider pattern during the post treatment process.

By way of example, the first grafting monomer ($R_g$) or the second grafting monomer ($R_{g'}$) may interact with an acid, and as such the first grafting monomer ($R_g$) and the second grafting monomer ($R_{g'}$) may include a base such as a monomer having a given basicity. Thus, in some embodiments, the acid dissociation constant, $pK_a$ of the first grafting monomer ($R_g$) and/or of the second grafting monomer ($R_{g'}$) is greater than 7. In some examples, the first grafting monomer ($R_g$) and/or the second grafting monomer ($R_{g'}$) may include one or more functional groups such as an $NH_3$ group, a 1°-3° amine group, an $OH^-$ group, an $NCS^-$ group, an alkenyl group, a phenol group, a C5-C20 heterocyclic group, or a CN group. In some embodiments, the first grafting monomer ($R_g$) and the second grafting monomer ($R_{g'}$) have different bonding strengths with respect to the guider pattern (e.g., the guider patterns 102, 104, 106), and thus there is a selective interaction between the first and second grafting monomers and the guider pattern. As such, in some embodiments, the basicity of the first grafting monomer ($R_g$) and the second grafting monomer ($R_{g'}$) may be different. In some embodiments, a delta $pK_a$ (e.g., difference in $pK_a$ between the first and second grafting monomers) is greater than 0.3. In some cases, the delta $pK_a$ is greater than 0.5. In some embodiments, the organic-soluble monomer ($R_s$) is an organic compound such as an aliphatic compound, which enhances solubility. In some embodiments, the organic-soluble monomer ($R_s$) may include a C5-C20 alkyl group, a cycloalkyl group, a C5-C20 saturated or unsaturated hydrocarbon ring, or a C5-C20 heterocyclic group.

In various embodiments, the treatment material 200 may include a polymer chain including a block copolymer or a random copolymer. In some examples, and with reference to FIG. 2B, a chemical structure of the treatment material 200 may include the first grafting monomer ($R_g$), the second grafting monomer ($R_{g'}$), and the organic-soluble monomer ($R_s$) bonded to $A_3$, $A_2$ and $A_1$, respectively, where each of $A_1$, $A_2$ and A3 may be COO— or PhO—. $A_1$, $A_2$ and A3 in turn are bonded to a chemical backbone as part of chemicals X, Y and Z, respectively. In some embodiments, the mole ratios of X to Y to Z are described by $X+Y+Z=1.0$, $0.1<X<0.9$, $0.25<Y<0.5$, and $0<Z<0.5$. $X_a$, $X_b$ and $X_c$, which are also bonded to the backbone, may be hydrogen or methyl.

Figure 3B:
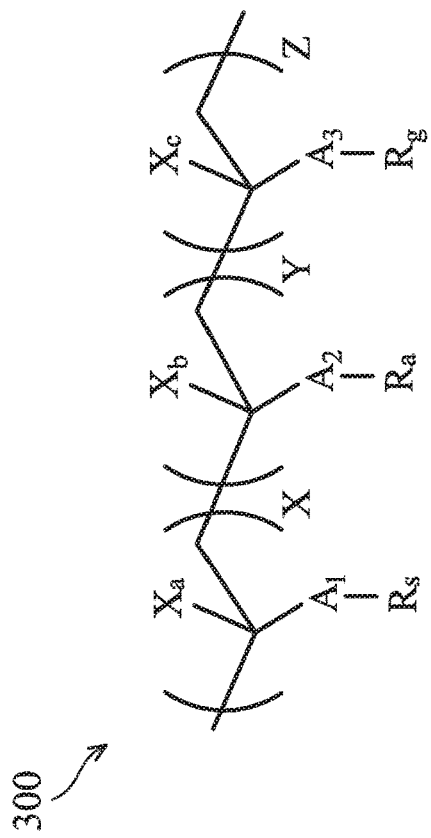
FIGS. 3A and 3B illustrate various aspects of a second treatment material, in accordance with some embodiments.
Figure 3A:
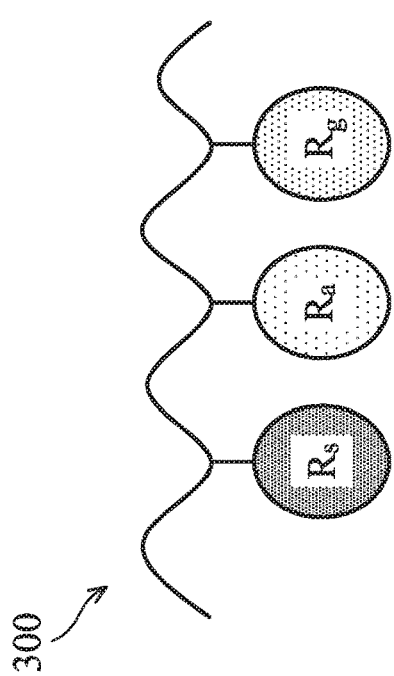

With reference to the example of FIGS. 3A and 3B, illustrated therein is a second treatment material 300, in accordance with some embodiments. In various embodiments, the treatment material 300 may be different than the treatment material 200 and the treatment material 300 may include one or more of a grafting monomer ($R_g$), an active site ($R_a$), and an organic-soluble monomer ($R_s$). In various examples, the treatment material 300 interacts with the guider pattern (e.g., the guider patterns 102, 104, 106). To be sure, one or more aspects or constituents of the treatment material 200 may be likewise present in the treatment material 300, and vice-versa. Additionally, in some embodiments, the treatment material 300 includes at least one active site for interaction with post-treatment materials (e.g., a pattern shrink material or other material deposited after the treatment material 300). By way of example, the organic-soluble monomer ($R_s$) is introduced to enhance solubility in a developer. In various examples, the active site ($R_a$) has inter-molecular interaction with the grafting monomer ($R_g$) and the active site ($R_a$) could enhance the bonding strength within the polymer (e.g., within the treatment material 300). In some embodiments, the treatment material 300 may be applied onto a specific pattern for enhanced performance (e.g., for enhanced resolution and/or pattern shrinkage). In some cases, the treatment material 300 may be applied to any of a variety of guider pattern shapes, as discussed above, including peanut shape an elongated trench, or other appropriate pattern.

Figure 4A:
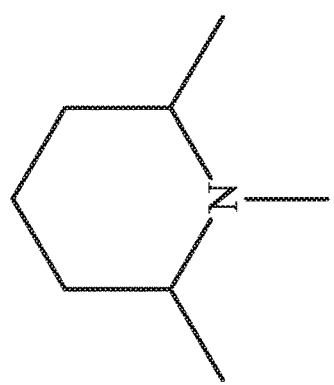
FIGS. 4A, 4B, and 4C illustrate examples of a grafting monomer ($R_g$), in accordance with some embodiments.
Figure 4B:
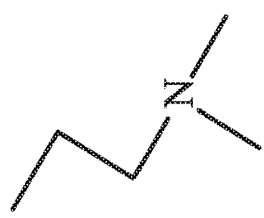
Figure 4C:
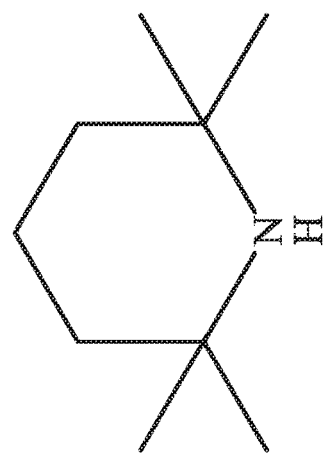
Figure 5B:
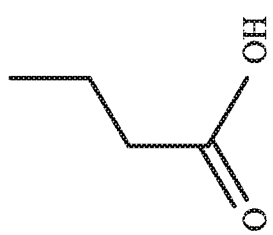
FIGS. 5A, 5B, 5C, and 5D illustrate examples of an active site ($R_a$), in accordance with some embodiments.
Figure 5D:
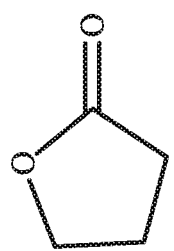
Figure 5A:
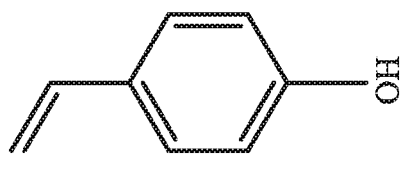
Figure 5C:
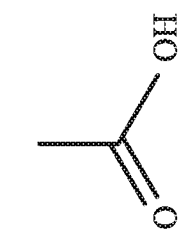

By way of example, the grafting monomer ($R_g$) may interact with an acid, and as such the grafting monomer ($R_g$) may include a base such as a monomer having a given basicity. Thus, in some embodiments, the $pK_a$ of the grafting monomer ($R_g$) is greater than 7. In some examples, the grafting monomer ($R_g$) may include one or more functional groups such as an $NH_3$ group, a 1°-3° amine group, an $OH^-$ group, an $NCS^-$ group, an alkenyl group, a phenol group, a C5-C20 heterocyclic group, or a CN group. Additional examples of the grafting monomer ($R_g$) are provided in FIGS. 4A-4C. In some embodiments, the active site ($R_a$) may include an acidity monomer. In some examples, the active site ($R_a$) may include a functional group such as a hydroxyl group, a carboxyl group, a phenolic compound, carboxylic acid, or combinations thereof. Additional examples of the active site ($R_a$) are provided in FIGS. 5A-5D. In some embodiments, the organic-soluble monomer ($R_s$) is an organic compound such as an aliphatic compound, which enhances solubility. In some embodiments, the organic-soluble monomer ($R_s$) may include a C5-C20 alkyl group, a cycloalkyl group, a C5-C20 saturated or unsaturated hydrocarbon ring, or a C5-C20 heterocyclic group.

In various embodiments, the treatment material 300 may include a polymer chain including a block copolymer or a random copolymer. In some examples, and with reference to FIG. 3B, a chemical structure of the treatment material 300 may include the grafting monomer ($R_g$), the active site ($R_a$), and the organic-soluble monomer ($R_s$) bonded to $A_3$, $A_2$ and $A_1$, respectively, where each of $A_1$, $A_2$ and A3 may be COO— or PhO—. $A_1$, $A_2$ and A3 in turn are bonded to a chemical backbone as part of chemicals X, Y and Z, respectively. In some embodiments, the mole ratios of X to Y to Z are described by $X+Y+Z=1.0$, $0<X<1$, $0<Y<1$, and $0<Z<1$. $X_a$, $X_b$ and $X_c$, which are also bonded to the backbone, may be hydrogen or methyl.

In various embodiments, the treatment materials 200, 300 may be used to treat the resist material (e.g., a patterned resist layer). With reference now to FIG. 6, shown therein is a flow chart of a semiconductor manufacturing method 600, illustrating use of a treatment material (e.g., the treatment material 200, 300). Additional steps may also be provided before, during, and after the method 600, and some steps described can be replaced, eliminated, or moved before or after other steps for additional embodiments of the method. It is also noted that the method 600 is exemplary, and is not intended to limit the present disclosure beyond what is explicitly recited in the claims that follow. The method 600 will be further described below in conjunction with FIGS. 7A-7D.

In various embodiments, the method 600 begins at block 602 where a substrate 702 is provided. In some embodiments, the substrate 702 includes a metal, a metal alloy, a metal nitride, a sulfide, a selenide, an oxide, and/or a silicide with the formula 'MXa', where M is a metal and X is N, S, Se, O, or Si with 'a' equal to about 0.4-2.5. For example, in at least some embodiments, the substrate 702 includes one or more of Ti, Al, Co, Ru, TiN, WN2, and TaN. Alternatively, in some embodiments, the substrate 702 includes Si, a metal oxide, and/or a metal nitride with the formula 'MXb', where M is a metal or Si, and X is N or O with 'b' equal to about 0.4-2.5. For example, in at least some embodiments, the substrate 702 includes one or more of $SiO_2$, silicon nitride, aluminum oxide, hafnium oxide, and lanthanum oxide.

Generally, and in some embodiments, the substrate 702 may include an underlayer (or material layer), formed over the substrate 702, to be processed (e.g., to be patterned or to be implanted). In some examples, the substrate 702 itself is to be processed. In some cases, the underlayer may include a hard mask layer to be patterned. In some examples, the underlayer may include an epitaxial semiconductor layer to be ion implanted. In an embodiment, the underlayer may include a hard mask layer including material(s) such as silicon oxide, silicon nitride (SiN), silicon oxynitride, titanium nitride, or other suitable material or composition. In some embodiments, the underlayer may include an anti-reflection coating (ARC) layer such as a nitrogen-free anti-reflection coating (NFARC) layer including material(s) such as silicon oxide, silicon oxygen carbide, or plasma enhanced chemical vapor deposited silicon oxide. In various embodiments, the underlayer may include a high-k dielectric layer, a gate layer, a hard mask layer, an interfacial layer, a capping layer, a diffusion/barrier layer, a dielectric layer, a conductive layer, other suitable layers, and/or combinations thereof. While some examples of underlayers have been given, such examples are not meant to be limiting, and other suitable underlayers may be equally used without departing from the scope of the present disclosure.

The method 600 proceeds to block 604 where a photoresist layer (or simply a resist layer) is formed over the substrate 702, or over the underlayer disposed on the substrate 702. In various embodiments, a photoresist layer (or simply resist layer) is first formed over the substrate 702, or over the underlayer disposed on the substrate. In various examples, the resist layer may include at least a polymer, a photoacid generator (PAG), a quencher (base), and a solvent. In some embodiments, the resist layer includes a positive tone resist including an acid-cleavable polymer. By way of example, the PAG may release acid after optical exposure (e.g., UV exposure), and the released acid may then cleave the acid-cleavable polymer in a subsequent post exposure baking (PEB) step. In some examples, after the acid cleaves the acid-cleavable polymer, the polymer (e.g., the resist) may become more hydrophilic, and the polymer may not be able to be dissolved (e.g., by a solvent or basic solution). In some embodiments, the resist layer may alternatively include a negative tone resist including at least one of an acid catalyzed cross-linkable polymer and a polymeric pinacol. By way of example, the PAG may release acid after optical exposure (e.g., UV exposure), and the released acid may then catalyze the cross-linking of the acid catalyzed cross-linkable polymer or the pinacol rearrangement of the polymeric pinacol. In some examples, after the cross linking or the pinacol rearrangement, the polymer (e.g., the resist) may become more hydrophobic, and the polymer may not be able to be dissolved (e.g., by a basic solution). In some cases, the resist layer may further include a surfactant, a chromophore, and a cross-linker. In some embodiments, the photoresist polymer may have a molecular weight (MW) between about 1,000 to about 20,000. In various embodiments, the resist layer is sensitive to radiation used in a lithography exposure process and has a resistance to etching processes (or ion implantation processes). In some embodiments, the resist layer may be formed by a spin-on coating process. In some examples, prior to forming the resist layer, an adhesion layer (e.g., such as an HMDS layer) is formed over the substrate, or over the optional underlayer disposed on the substrate. In some embodiments, after formation of the resist layer, and prior to performing an exposure process, a pre-bake process may be performed, for example, to evaporate solvents and to densify the resist layer. In various embodiments, the resist layer is sensitive to various types of radiation, such as DUV radiation (e.g., 248 nm radiation from a KrF laser or 193 nm radiation from an ArF laser), EUV radiation (e.g., 13.5 nm radiation), an electron beam (e-beam), or an ion beam. Generally, in various embodiments, the resist layer may be sensitive to radiation having a wavelength less than about 250 nm. In some embodiments, the resist may include a tri-layer stack that includes a resist over a bottom anti-reflective coating (BARC) layer over an organic underlayer.

The method 600 proceeds to block 606 where the resist layer is patterned. Generally, after formation of the resist layer, a pattern is exposed onto the resist-coated substrate. For example, in various embodiments, the resist layer may be exposed (e.g., by a lithographic imaging system) through an intervening mask. In some embodiments, the resist layer is exposed by EUV radiation (e.g., 13.5 nm). Alternatively, in some embodiments, the resist layer may be exposed by DUV radiation (e.g., from a 248 nm KrF excimer laser or a 193 nm ArF excimer laser), X-ray radiation, an e-beam, an ion beam, and/or other suitable radiation sources. In various examples, the exposure of the resist layer may be performed in air, in a liquid (e.g., immersion lithography), or in a vacuum (e.g., for EUV lithography and e-beam lithography). In some embodiments, the radiation beam is patterned with a mask, such as a transmissive mask or a reflective mask, which may include resolution enhancement features such as phase-shifting features and/or optical proximity correction (OPC), and which may be performed using off-axis illumination (OAI). In some other embodiments, the radiation beam is directly modulated with a predefined pattern, such as an IC layout, without using a mask (such as using a digital pattern generator or direct-write mode).

In some embodiments, after exposure of the pattern onto the resist-coated substrate, a baking process may be performed. For example, in some embodiments, after exposure of the resist layer, and prior to performing a resist development process, a post-bake process may be performed to stabilize and harden the developed resist layer. In some examples, as a result of the exposure process, a latent pattern is formed in the resist layer. By way of example, the latent pattern refers to the exposed pattern on the resist layer, which will subsequently become a physical resist pattern, after a developing process. In various embodiments, the latent pattern of the resist layer may include unexposed portions and exposed portions of the resist layer. In various embodiments, the exposed portions of the resist layer may be physically or chemically changed as a result of the exposure process. In some embodiments, if a positive-tone resist has been used, the exposed portions will be dissolved during a subsequent development process. In some cases, if a negative-tone resist has been used, the exposed portions will become insoluble and a subsequent development process may instead dissolve the unexposed portions.

In some embodiments, after the baking process, a development process is performed to form a patterned resist layer (e.g., as shown in FIGS. 7A-7D). For example, after formation of the latent image and in various embodiments, a resist development process is performed, resulting in a patterned resist layer 704 on the substrate 702. In some examples, the patterned resist layer 704 may have a non-uniform pattern profile (e.g., rough edges, non-uniform pattern widths, etc.). In some embodiments, the resist development process includes a wet chemical development process, as known in the art. As discussed above, if a positive-tone resist has been used, the exposed portions will be dissolved during the development process, and if a negative-tone resist has been used, the exposed portions will be insoluble and instead the unexposed portions will be removed.

The method 600 proceeds to block 608 where the treatment material is deposited over the patterned resist layer.

Figure 7B:
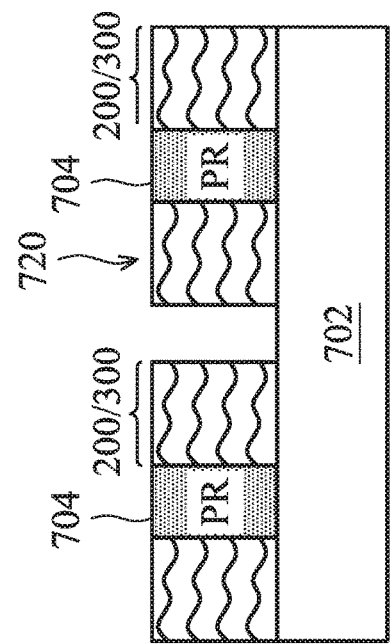
FIGS. 7A, 7B, 7C, and 7D provide top-down and cross-sectional views of a semiconductor structure at various fabrication stages, constructed in accordance with the method of FIG. 6.
Figure 7C:
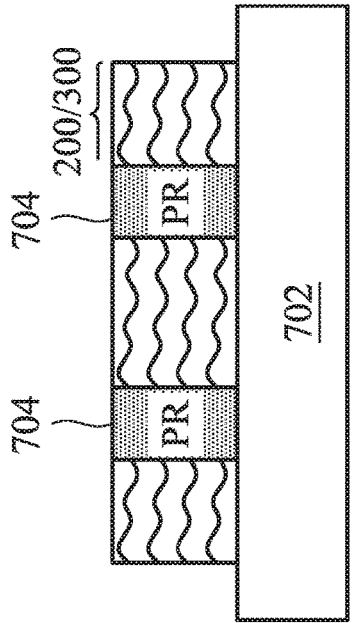
Figure 7A:
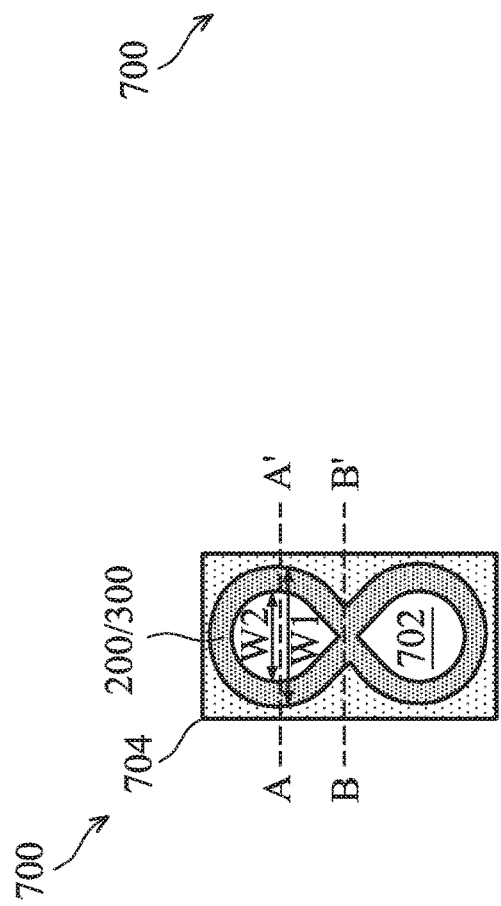
Figure 7D:
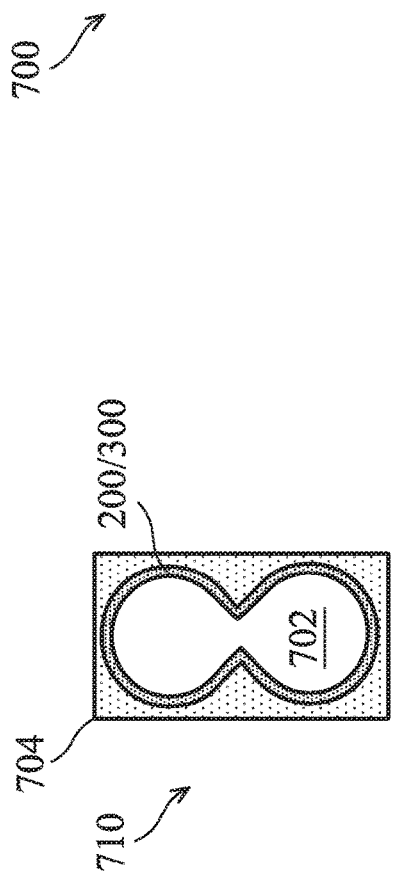

Referring to the example of FIGS. 7A, 7B, and 7C, and in an embodiment of block 608, the treatment material (e.g., the treatment material 200 or 300) may be deposited over the patterned resist layer 704, thereby coating the patterned resist layer (e.g., the guider pattern), including coating any non-uniformities in the pattern profile that may be present. FIG. 7A shows a top-down view of a structure 700 including a guider pattern (e.g., formed from a patterned resist layer) and disposed on a substrate. FIG. 7B shows a cross-section view of the structure 700 along a section A-A', as denoted in FIG. 7A. FIG. 7C shows a cross-section view of the structure 700 along a section B-B', as denoted in FIG. 7A. Thus, as shown in the examples of FIGS. 7A-7C, the treatment material (e.g., having a first thickness) may serve to shrink an effective pattern width (e.g., from 'W1' to 'W2'), and may be used to merge narrow width portions of the guider pattern to form separate features (e.g., along the section B-B' of FIG. 7A). In some cases, a subsequent shrink material may be deposited onto the treated guider pattern to further shrink pattern features, to merge narrow width portions of a guider pattern, or to modify a shape of the pattern features. With reference to FIG. 7D, illustrated therein is a top-down view of an alternative structure 710 including a guider pattern. As shown in FIG. 7D, deposition of the treatment material (e.g., having a second thickness less than the first thickness) may not merge narrow width portions of the guider pattern, but may instead merely serve to at least partially shrink an effective pattern width and provide a more uniform treated resist surface profile. For example, with reference to FIG. 7B, a uniform layer of active sites 720 present at an exposed lateral surface of the treatment material ensure a more profile-independent surface for subsequent processes (e.g., subsequently deposited shrink material, etc.). In various embodiments, the treatment material may be deposited by a spin-coating process, a vapor deposition process, or other suitable process. In some embodiments, after deposition of the treatment material onto the patterned resist layer, a baking step may optionally be performed. In various embodiments, the treatment material may bond to surfaces of the patterned resist layer by way of hydrogen bonding, ionic bonding, or covalent bonding.

The method 600 proceeds to block 610 where an unbonded portion of the treatment material is removed. For example, after the coating and optional baking of the treatment material, portions of the treatment material not bonded to surfaces of the patterned resist layer may be removed (e.g., using a solvent, such as described above). In various embodiments, and as a result of the bonding of the treatment material to the patterned resist layer, the treated patterned resist layer includes resist patterns that are substantially insensitive to the profile of the patterned resist. Stated another way, the treated patterned resist layer includes patterns having more uniform patterns (e.g., a lower LWR) than the untreated patterned resist layer. Thus, the treated patterned resist layer is provided for patterns having better resolution and better CD shrinkage. In some cases, one or more additional post-treatment processed may be performed, for example, as part of a pattern shrinkage process. In such examples, a subsequent pattern shrink material may be deposited onto the treatment material. Alternatively, in some embodiments, the treatment material and treatment material deposition process itself may be used at the pattern shrinkage process.

In some examples, after the treatment process and formation of the treated patterned resist layer, a fabrication process may be performed to the exposed substrate or underlayer through openings of the treated patterned resist layer, where the treated patterned resist layer is used as a mask. In some embodiments, such a fabrication process may include an etching process applied to the underlayer using the treated patterned resist layer as an etch mask, thereby transferring the pattern from the treated patterned resist layer to the underlayer. Alternatively, in some embodiments, the fabrication process may include an ion implantation process using the treated patterned resist layer as an ion implantation mask, thereby forming various doped features (e.g., within the underlayer). In some embodiments, other fabrication processes may alternatively be performed while using the treated patterned resist layer as a mask.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

More specifically, and as discussed above, additional steps may also be provided before, during, and after the method 600, and some steps described can be replaced, eliminated, or moved before or after other steps for additional embodiments of the method. For example, in an embodiment, the substrate 702 includes a semiconductor substrate and the method 600 proceeds to forming FinFET devices. In such an example, the method 600 may further include forming a plurality of fins in the semiconductor substrate. Additionally, and in furtherance of this example, the method 600 may further include etching the semiconductor substrate to form trenches in the semiconductor substrate; filling the trenches with a dielectric material; performing a chemical mechanical polishing (CMP) process to form shallow trench isolation (STI) features; epitaxial growth and/or recessing of the STI features to form fin-like active regions. In some embodiments, the method 600 includes other steps to form a plurality of gate electrodes, gate spacers, doped source/drain regions, contacts for gate/source/drain features, etc. In some embodiments, subsequent processing may form various contacts/vias/lines and multi-layers interconnect features (e.g., metal layers and interlayer dielectrics) on the substrate, configured to connect the various features to form a functional circuit that may include one or more devices (e.g., one or more FinFET devices). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Those of ordinary skill in the art having benefit of this disclosure will recognize other embodiments and applications of the treatment material, without departing from the scope of the present disclosure.

It is noted that the treatment material and methods of the present disclosure are not limited to a particular substrate type, mask type, resist type, radiation source (e.g., radiation wavelength), and/or lithography system type. For example, the treatment material and methods thereof may be applied to resist used to pattern features and/or devices on a variety of substrate materials such as silicon, germanium, silicon carbide (SiC), silicon germanium (SiGe), diamond, compound semiconductors, alloy semiconductors, and the substrate may optionally include one or more epitaxial layers (epi-layers), may be strained for performance enhancement, may include a silicon-on-insulator (SOI) structure, and/or have other suitable enhancement features. Embodiments of the present disclosure may further be applicable to processes employing reflective masks (e.g., such as used for extreme ultraviolet (EUV) lithography), transmissive masks, binary intensity masks, phase-shifting masks, as well as other mask types known in the art. In some examples, embodiments disclosed herein may be applied to processes employing various types of resist such as poly(methyl methacrylate) (PMMA), SU-8, an EUV resist, a positive-tone resist, a negative-tone resist, or other types of resist as known in the art. Additionally, embodiments of the present disclosure are applicable to various lithography system/aligner types such as a contact aligner, a proximity aligner, a projection aligner, or an EUV lithography system. Thus, embodiments of the present disclosure may further be applicable to systems employing any of a variety of radiation sources (radiation wavelengths) such as UV light, deep UV (DUV) light, EUV light, or other radiation sources as known in the art.

The various embodiments described herein offer several advantages over the existing art. It will be understood that not all advantages have been necessarily discussed herein, no particular advantage is required for all embodiments, and other embodiments may offer different advantages. For example, embodiments discussed herein include a material composition and method for treating a resist material (e.g., a patterned resist layer), and thereby providing better pattern shrinkage and/or resolution enhancement, is disclosed. In various embodiments, the material composition and treatment process disclosed herein may be used to minimize the sensitivity to the pattern profile of the resist. In some cases, the embodiments disclosed herein may also be used to modify the pattern profile (e.g., prior to a pattern shrinkage process). Alternatively, in some embodiments, the treatment material itself may be used for the pattern shrinkage process, thereby providing a pattern shrinkage process that is substantially insensitive to the pattern profile of the resist. Thus, embodiments of the present disclosure serve to overcome various shortcomings of at least some current resist compositions and methods.

Thus, one of the embodiments of the present disclosure described a method that includes forming a patterned resist layer on a substrate. In various embodiments, the patterned resist layer has a first pattern width, and the patterned resist layer has a first pattern profile having a first proportion of active sites. In some examples, the patterned resist layer is coated with a treatment material. In some embodiments, the treatment material bonds to surfaces of the patterned resist layer to provide a treated patterned resist layer having a second pattern profile with a second proportion of active sites greater than the first proportion of active sites. By way of example, and as part of the coating the patterned resist layer with the treatment material, a first pattern shrinkage process may be performed, where the treated patterned resist layer has a second pattern width less than a first pattern width.

In another of the embodiments, discussed is a method where a guider pattern is formed on a substrate, wherein the guider pattern has a first pattern width. In some embodiments, the guider pattern is treated with a treatment material to provide a treated guider pattern. The treatment material may include at least one grafting monomer, where the at least one grafting monomer bonds to lateral surfaces of the guider pattern. In various examples, the treated guider pattern has a smaller effective pattern width than the guider pattern, and the treatment material provides a uniform layer of active sites along lateral surfaces of the treated guider pattern.

In yet another of the embodiments, discussed is a method of semiconductor device fabrication including forming a resist layer over a substrate. In some embodiments, an exposure process is performed to the resist layer, where the exposure process is performed using an EUV light source and projected onto the resist layer through an intervening mask including a circuit pattern. In various examples, after performing the exposure process, the exposed resist layer is developed to form a patterned resist layer. In some embodiments, the patterned resist layer includes the circuit pattern. In addition, in various cases, the patterned resist layer has a first pattern width, and the patterned resist layer has a first pattern profile having a first proportion of active sites. In some embodiments, the patterned resist layer is then coated with a treatment material, where the treatment material bonds to surfaces of the patterned resist layer to provide a treated patterned resist layer having a second pattern profile with a second proportion of active sites greater than the first proportion of active sites. In various examples, as part of the coating the patterned resist layer with the treatment material, a first pattern shrinkage process is performed, where the treated patterned resist layer has a second pattern width less than a first pattern width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a patterned resist layer on a substrate, wherein the patterned resist layer has a first pattern width, wherein the patterned resist layer has a first pattern profile having a first sidewall surface, and wherein the first sidewall surface has different regions with different types of active sites;
    coating the patterned resist layer with a treatment material, wherein the treatment material bonds to the different types of active sites on the first sidewall surface of the patterned resist layer to provide a treated patterned resist layer having a second pattern profile including a second sidewall surface, wherein the second sidewall surface has a uniform type of active sites configured to bond with a subsequently deposited layer; and
    as part of the coating the patterned resist layer with the treatment material, performing a first pattern shrinkage process, wherein the treated patterned resist layer has a second pattern width less than a first pattern width.

2. The method of claim 1, further comprising:
    after performing the first pattern shrinkage process, performing a second pattern shrinkage process of the treated patterned resist layer by depositing a shrink material onto the treated patterned resist layer.

3. The method of claim 1, wherein the first pattern profile has a first roughness, and wherein the second pattern profile has a second roughness less than the first roughness.

4. The method of claim 1, wherein the patterned resist layer includes a guider pattern having merged or separate 1×2, 1×3, 1×N, or N×N square or elongated holes, wherein N is greater than 3.

5. The method of claim 1, wherein the treatment material includes one or more of a first grafting monomer ($R_g$), a second grafting monomer ($R_{g'}$), and an organic-soluble monomer ($R_s$).

6. The method of claim 1, wherein the treatment material includes at least one solvent selected from a group including n-butyl acetate, 2-heptanone, PGMEA, PGME, PGEE, CHN, GBL, and MIBC.

7. The method of claim 5, wherein the first grafting monomer ($R_g$) and the second grafting monomer ($R_{g'}$) include a base having a given basicity, and wherein each of the first grafting monomer ($R_g$) and the second grafting monomer ($R_{g'}$) has a $pK_a$ value greater than 7.

8. The method of claim 5, wherein the first grafting monomer ($R_g$) and the second grafting monomer ($R_{g'}$) include at least one of an $NH_3$ group, a 1°-3° amine group, an OH— group, an NCS— group, an alkenyl group, a phenol group, a C5-C20 heterocyclic group, and a CN group.

9. The method of claim 7, wherein a difference in the $pK_a$ value between the first grafting monomer ($R_g$) and the second grafting monomer ($R_{g'}$) is greater than 0.3.

10. The method of claim 5, wherein the organic-soluble monomer ($R_s$) includes a C5-C20 alkyl group, a cycloalkyl group, a C5-C20 saturated or unsaturated hydrocarbon ring, or a C5-C20 heterocyclic group.

11. The method of claim 1, wherein the treatment material includes one or more of a grafting monomer ($R_g$), an active site ($R_a$), and an organic-soluble monomer ($R_s$).

12. The method of claim 11, wherein the active site ($R_a$) includes a functional group selected from the group consisting of a hydroxyl group, a carboxyl group, a phenolic compound, carboxylic acid, and combinations thereof.

13. A method, comprising:
   forming a guider pattern on a substrate using a positive tone resist, wherein the guider pattern has a first pattern width; and
   treating the guider pattern with a treatment material to provide a treated guider pattern, wherein the treatment material includes at least one grafting monomer, and wherein the at least one grafting monomer bonds to lateral surfaces of the guider pattern;
   wherein the treated guider pattern has a smaller effective pattern width than the guider pattern, and wherein the treated guider pattern includes an exposed sidewall surface having a uniform type of active sites configured to bond with a subsequently deposited shrink material.

14. The method of claim 13, wherein the treatment material includes at least two grafting monomers, and wherein each grafting monomer bonds with a different bonding strength to the guider pattern.

15. The method of claim 13, further comprising:
   after treating the guider pattern, depositing a shrink material onto the treated guider pattern, thereby reducing the effective width of the treated guider pattern.

16. The method of claim 13, wherein the treatment material includes one or more of a first grafting monomer ($R_g$), a second grafting monomer ($R_{g'}$), and an organic-soluble monomer ($R_s$).

17. The method of claim 13, wherein the treatment material includes one or more of a grafting monomer ($R_g$), an active site ($R_a$), and an organic-soluble monomer ($R_s$).

18. A method of semiconductor device fabrication, comprising:
   forming a resist layer over a substrate;
   patterning the resist layer to form a patterned resist layer, wherein the patterned resist layer includes a circuit pattern, and wherein the patterned resist layer has a first pattern width, and wherein the patterned resist layer has a first pattern profile having a first sidewall surface with different types of active sites;
   coating the patterned resist layer with a treatment material, wherein the treatment material bonds to the different types of active sites of the first sidewall surface of the patterned resist layer to provide a treated patterned resist layer having a second pattern profile including a second sidewall surface, wherein the second sidewall surface has a uniform type of active sites configured to bond with a subsequently deposited layer; and
   as part of the coating the patterned resist layer with the treatment material, performing a first pattern shrinkage process, wherein the treated patterned resist layer has a second pattern width less than a first pattern width.

19. The method of claim 18, wherein the treatment material includes one or more of a first grafting monomer ($R_g$), a second grafting monomer ($R_{g'}$), an active site ($R_a$), and an organic-soluble monomer ($R_s$).

20. The method of claim 1, wherein the patterned resist layer includes a positive tone resist.

* * * * *